United States Patent
Saito

(10) Patent No.: US 9,283,773 B2
(45) Date of Patent: Mar. 15, 2016

(54) PLASMA PROCESSING DEVICE AND IMAGE FORMING APPARATUS INCLUDING THE SAME

(71) Applicant: Akira Saito, Kanagawa (JP)

(72) Inventor: Akira Saito, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 14/718,705

(22) Filed: May 21, 2015

(65) Prior Publication Data

US 2015/0336403 A1 Nov. 26, 2015

(30) Foreign Application Priority Data

May 23, 2014 (JP) ................................. 2014-107123

(51) Int. Cl.
*B41J 11/00* (2006.01)
*B41J 11/04* (2006.01)
*H01J 37/32* (2006.01)

(52) U.S. Cl.
CPC ....... *B41J 11/0015* (2013.01); *H01J 37/32532* (2013.01)

(58) Field of Classification Search
CPC ................. B41J 11/0015; H01J 37/32532
USPC .......................................................... 347/101
See application file for complete search history.

(56) References Cited

U.S. PATENT DOCUMENTS

| 8,186,823 | B2 | 5/2012 | Saitoh et al. | |
|---|---|---|---|---|
| 2009/0290007 | A1* | 11/2009 | Saitoh | C09D 11/322 347/102 |
| 2013/0215194 | A1* | 8/2013 | Leoni | B41J 2/1652 347/34 |
| 2013/0250017 | A1* | 9/2013 | Saitoh | C08J 7/00 347/101 |
| 2014/0078212 | A1 | 3/2014 | Nakai et al. | |
| 2015/0035918 | A1 | 2/2015 | Matsumoto et al. | |

FOREIGN PATENT DOCUMENTS

| JP | 2000-007802 | 1/2000 |
|---|---|---|
| JP | 2003-173899 | 6/2003 |
| JP | 2003-201568 | 7/2003 |
| JP | 2009-279796 | 12/2009 |
| JP | 2010-188568 | 9/2010 |
| JP | 4662590 | 1/2011 |
| JP | 2013-199017 | 10/2013 |

* cited by examiner

*Primary Examiner* — Stephen Meier
*Assistant Examiner* — Alexander D Shenderov
(74) *Attorney, Agent, or Firm* — Duft Bornsen & Fettig LLP

(57) ABSTRACT

A plasma processing device in an image forming apparatus includes: a first electrode; a second electrode which is disposed opposing to the first electrode to form a discharge space, has a hollow inside, and has both ends open; and a partition wall disposed at the side opposite to the first electrode with respect to the second electrode for forming a first wind tunnel in combination with a subject to be processed, when the subject to be processed is present in the discharge space, the first wind tunnel restricting a flow of a first cooling medium.

8 Claims, 7 Drawing Sheets

PLASMA PROCESSING DEVICE AND IMAGE FORMING APPARATUS INCLUDING THE SAME

CROSS-REFERENCE TO RELATED APPLICATIONS

The present application claims priority to and incorporates by reference the entire contents of Japanese Patent Application No. 2014-107123 filed in Japan on May 23, 2014.

BACKGROUND OF THE INVENTION

1. Field of the Invention

The present invention relates to a plasma processing device and an image forming apparatus including the same.

2. Description of the Related Art

Since a conventional ink jet recording device mainly employs a shuttle system in which a head reciprocates in a widthwise direction of a recording medium represented by a sheet of paper or a film, a throughput brought about a high-speed printing is difficult to be enhanced. In view of this, a one-pass system in which a plurality of heads is arranged to cover the entire width of a recording medium and an image is recorded at a time has recently been proposed in order to cope with high-speed printing.

The one-pass system is advantageous for increasing speed. However, as a result of depositing adjacent dots at short intervals, the adjacent dot is deposited before previously deposited ink permeates into a recording medium, resulting in that coalescence of adjacent dots (hereinafter referred to as "deposition interference") is easily to occur, which is liable to deteriorate image quality.

In view of the above problem, there is a need to provide a plasma processing device that can modify a surface of a subject to be processed in order that a high-quality printed matter can be created, and an image forming apparatus including the same.

SUMMARY OF THE INVENTION

It is an object of the present invention to at least partially solve the problems in the conventional technology.

According to the present invention, there is provided a plasma processing device comprising: a first electrode; a second electrode which is disposed opposing to the first electrode to form a discharge space, has a hollow inside, and has both ends open; and a partition wall disposed at the side opposite to the first electrode with respect to the second electrode for forming a first wind tunnel in combination with a subject to be processed, when the subject to be processed is present in the discharge space, the first wind tunnel restricting a flow of a first cooling medium.

The present invention also provides an image forming apparatus comprising: the above-described plasma processing device; and an ink jet recording device that forms an image onto the subject to be processed that has already undergone a plasma process with the plasma processing device, using an ink jet recording system.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
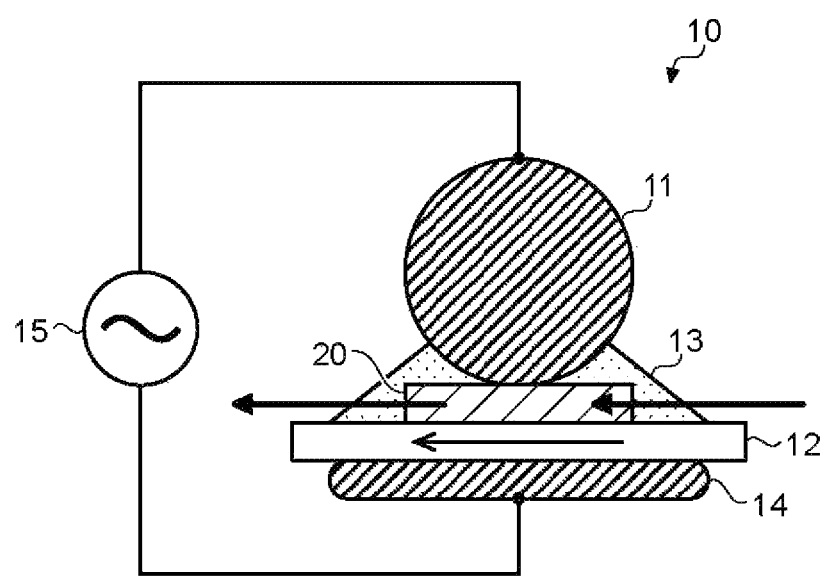
FIG. 1 is a schematic diagram illustrating an example of a plasma processing device for performing a plasma process employed in embodiments of the present invention.

Preferable embodiments of the present invention will be described below in detail with reference to the accompanying drawings. The embodiments described below are preferable embodiments of the present invention. Therefore, various restrictions which are technically preferable are imposed thereon. However, the scope of the present invention is not unfairly limited by the description below, and all configurations described in the embodiments are not essential elements of the present invention.

The embodiments described below have the following features to enable a production of a high-quality printed matter by modifying a surface of a subject to be processed. Specifically, in the embodiments, wettability of a modified surface of the subject to be processed or cohesive properties and/or permeability of ink pigments due to a reduction in pH value are controlled to implement improvement in ink dot roundness, prevention of dot coalescence, and reduction and uniformity of coalescence thickness of pigments on the subject to be processed. With this, a high-quality printed matter can easily be produced with high productivity. In view of this, the embodiments described below are configured such that a print control apparatus including a personal computer (hereinafter referred to as "PC") has a print setting table having registered thereon printing conditions suitable for a paper type (e.g., brand) of the subject to be processed, an ink set to be used (hereinafter referred to as "used ink set"), or resolution (or an amount of ink droplets for ink dots). By selecting the print setting table appropriately upon printing, optimum printing conditions can easily be set.

In the embodiments below, a plasma process can be employed as a process of modifying the surface of the subject to be processed. Before the embodiments are described, an example of the plasma process employed in the embodiments will firstly be described below in detail with reference to the drawings. With the plasma process employed in the embodiments, the subject to be processed is irradiated with plasma in the atmosphere to cause a reaction of polymers on the surface of the subject to be processed, thereby forming hydrophilic functional groups. Specifically, electrons e emitted from the discharge electrode are accelerated in an electric field to excite or ionize atoms and/or molecules in the atmosphere. Electrons are also emitted from the ionized atoms and/or molecules, and hence, high-energy electrons increase. Consequently, streamer discharge (plasma) occurs. With the high-energy electrons caused by the streamer discharge, a polymer bond (a coat layer 21 of coat paper is stiffened with calcium carbonate and starch serving as a binder, wherein the starch has a polymeric molecular structure) on the surface of the subject to be processed 20 (e.g., coat paper) is cut and recombined with oxygen radicals O*, hydroxyl radicals (*OH), or ozone $O_3$ in a gas phase. This is referred to as a plasma process. With the process, polar functional groups such as hydroxyl groups or carboxyl groups are formed on the surface of the subject to be processed 20. As a result, hydrophilic property or acidic property is applied on the surface of the subject to be processed 20. Note that the surface of the subject to be processed 20 is acidified (reduction in pH value) with the increase in carboxyl groups.

The adjacent dots on the surface of the subject to be processed spread and coalesce due to the increase in hydrophilic property on the surface of the subject to be processed. In order to prevent a color mixture between dots thus caused, it is necessary to quickly cohere colorants (e.g., pigment or dye) in a dot, or to dry a vehicle or permeate the vehicle into the subject to be processed before the vehicle spreads. As the plasma process stated above also acts as an acidification process means (step) for acidifying the surface of the subject to be processed, the cohesion speed of the colorants in the dot can be increased. On this point, it is considered that the execution of the plasma process as a pre-treatment of an ink jet recording process is effective.

In the embodiments below, an atmospheric pressure non-equilibrium plasma process utilizing dielectric barrier discharge can be used for the plasma process, for example. In the acidification process with atmospheric pressure non-equilibrium plasma, an electron temperature is extremely high, and a gas temperature is around a room temperature. Therefore, it is one of preferable methods for a plasma processing method applied to a subject to be processed such as a recording medium.

As a method of stably generating atmospheric pressure non-equilibrium plasma in a wide range, there is an atmospheric pressure non-equilibrium plasma process using dielectric barrier discharge with streamer breakdown. The dielectric barrier discharge with streamer breakdown can be generated by applying an alternating high voltage between electrodes coated with a dielectric, for example. However, note that various methods can be used as a method for generating atmospheric pressure non-equilibrium plasma, other than the above dielectric barrier discharge with streamer breakdown. Examples of the applicable methods include dielectric barrier discharge in which an insulating material such as a dielectric is inserted between electrodes, corona discharge in which a significantly non-uniform electric field is applied to a thin metal wire or the like, and pulse discharge in which a short pulse voltage is applied. Also, two or more of the above methods can be combined.

FIG. 1 is a schematic view illustrating an example of a plasma processing device for performing a plasma process employed in the embodiments described below. As illustrated in FIG. 1, a plasma processing device 10 including a discharge electrode 11, a counter electrode (also referred to as "ground electrode") 14, a dielectric 12, and a high-frequency high-voltage power source 15 can be used for a plasma process employed in the embodiments. In the plasma processing device 10, the dielectric 12 is disposed between the discharge electrode 11 and the counter electrode 14. The high-frequency high-voltage power source 15 applies a pulse voltage with a high frequency and a high voltage between the discharge electrode 11 and the counter electrode 14. A voltage value of the pulse voltage is about 10 kV (kilovolt) (p-p). The frequency of the pulse voltage can be, for example, about 20 kHz (kilohertz). The application of the high pulse voltage with a high frequency between two electrodes causes atmospheric pressure non-equilibrium plasma 13 between the discharge electrode 11 and the dielectric 12. A subject to be processed 20 passes between the discharge electrode 11 and the dielectric 12 during the generation of the atmospheric pressure non-equilibrium plasma 13. Thus, the surface of the subject to be processed 20 closer to the discharge electrode 11 is plasma-processed.

The plasma processing device 10 illustrated in FIG. 1 uses the discharge electrode 11 of a rotary-type and the dielectric 12 of a belt conveyer type. The subject to be processed 20 is held and conveyed between the discharge electrode 11 and the dielectric 12, thereby passing in the atmospheric pressure non-equilibrium plasma 13. With this process, the surface of the subject to be processed 20 comes in contact with the atmospheric pressure non-equilibrium plasma 13, and undergoes a uniform plasma process. However, the plasma processing device employed in the embodiments is not limited to that illustrated in FIG. 1. The plasma processing device can be modified in various ways, for example, to have a configuration in which the discharge electrode 11 is not in contact with but close to the subject to be processed 20, or a configuration in which the discharge electrode 11 is mounted on a carriage that is the same carriage used for an ink jet head. Further, instead of the dielectric 12 of a belt conveyer type, a sheet-type dielectric 12 can be used.

First Embodiment

Next, a plasma processing device according to a first embodiment of the present invention and an image forming apparatus including the same will be described in detail with reference to the drawings. Note that the first embodiment describes an image forming apparatus including ejection heads (recording heads, ink heads) for four colors of black (K), cyan (C), magenta (M), and yellow (Y). However, the image forming apparatus is not limited to have these ejection heads. Specifically, the image forming apparatus may further include ejection heads for green (G), red (R), and other colors, or may have only an ejection head for black (K). In the description below, K, C, M, and Y respectively correspond to black, cyan, magenta, and yellow.

In the first embodiment, rolled continuous paper (hereinafter referred to as roll paper) is used for the subject to be processed. However, the subject to be processed is not limited thereto, and any recording medium, such as a cut paper, can be used as far as an image can be formed thereon. If the subject to be processed is a sheet of paper, examples of types of the paper include plain paper, high-quality paper, recycled paper, thin paper, thick paper, and coat paper. In addition, a subject having a surface on which an image can be formed with ink and the like, such as an OHP sheet, a synthetic resin film, and a metal thin film, can also be used as the subject to be processed. Here, the roll paper may be continuous paper (continuous form paper, continuous form) having perforations that can be torn at predetermined intervals. In this case, a page in the roll paper means a region enclosed by the perforations at predetermined intervals, for example.

Figure 2:
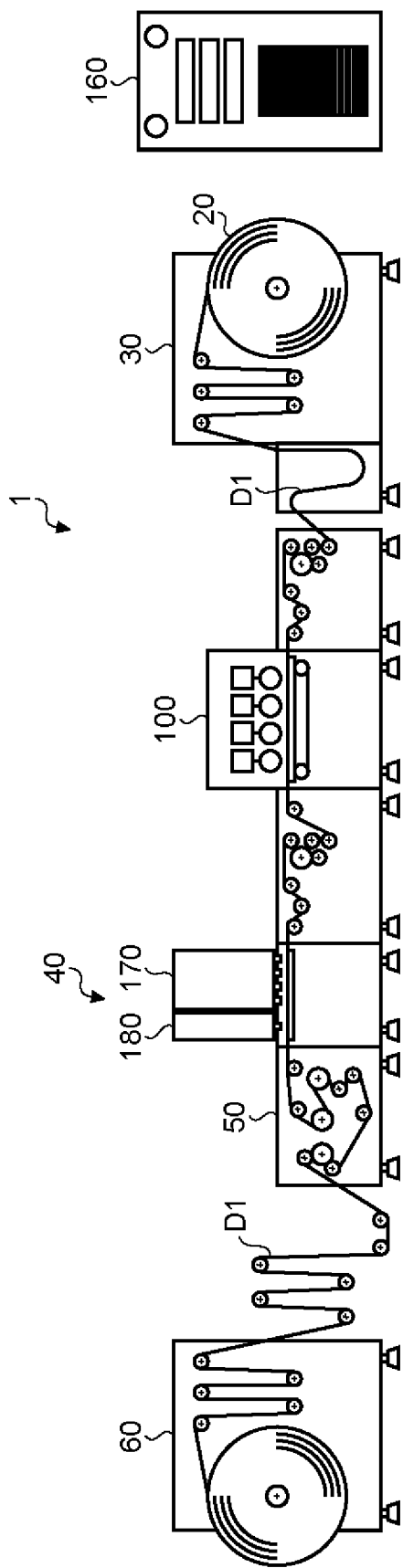
FIG. 2 is a schematic view illustrating an example of a schematic configuration of a printing apparatus (system) according to a first embodiment of the present invention.

FIG. 2 is a schematic view illustrating an example of a schematic configuration of a printing apparatus (system) serving as an image forming apparatus according to the first embodiment. As illustrated in FIG. 2, the printing apparatus (system) 1 includes a feeding unit 30 for feeding (conveying) the subject to be processed 20 (roll paper) along a conveyance path D1, a plasma processing device 100 that applies a plasma process to the fed subject to be processed 20 as a pre-treatment, and an image forming device 40 that forms an image onto the surface of the plasma-processed subject to be processed 20. The image forming device 40 can include an ink jet head 170 for forming an image onto the plasma-processed subject to be processed 20 with an ink jet process, and a pattern reading unit 180 that reads the image formed on the subject to be processed 20. The ink jet head 170 may be a so-called line head that can eject ink in a line in the width direction of the subject to be processed 20, a so-called multi-array head in which heads ejecting ink to a range narrower than the width of the subject to be processed 20 are staggered to form an image on the entire width, or a serial head that scans in a direction orthogonal to the conveyance path D1 of the subject to be processed 20 to form an image.

The image forming device 40 may include a post-processing unit that applies a post-process to the subject to be processed 20 having an image formed thereon. The printing apparatus (system) 1 may also have a drying unit 50 for drying the post-processed subject to be processed 20, and a discharge unit 60 that discharges the subject to be processed 20 having an image formed thereon (and also post-processed, in some cases). The pattern reading unit 180 may be provided at a position downstream of the drying unit 50 on the conveyance path D1. The printing apparatus (system) 1 may also have a control unit 160 that generates raster data from image data for printing or controls the respective units in the printing apparatus (system) 1. The control unit 160 should be able to communicate with the printing apparatus (system) 1 via wired or wireless network. The control unit 160 is not necessarily configured to include a single computer. It may have a configuration in which a plurality of computers is connected via a network such as LAN (Local Area Network). The control unit 160 may also be configured to have a control unit individually provided to each unit in the printing apparatus (system) 1. When the image forming apparatus is configured as a printing system, the control unit 160 may be included in any devices.

Each of the respective units (devices) illustrated in FIG. 2 may be formed as a separate unit, and these units may form the printing system 1 as a whole. When the image forming apparatus is configured as a printing system 1, the control unit 160 may be included in any units or devices.

Next, configurations of a discharge unit and a cooling mechanism in the plasma processing device 100 according to the first embodiment will be described in detail with reference to the drawings. It is to be noted that the discharge unit indicates a structure including the surroundings of the discharge electrode and the counter electrode.

During a surface modifying process of the subject to be processed with plasma, temperatures of the electrodes and the subject to be processed 20 rise due to discharge. This causes various troubles, in which, for example, the dielectric 120 is broken down, or the temperature of the ink jet head 170 in the image forming device 40 arises thereafter to cause deterioration in quality of the formed image or to make it impossible to form an image. A mechanism for cooling the electrodes and the subject to be processed 20 is considered to be provided to the discharge unit for suppressing the temperature rise of the electrodes and the subject to be processed 20.

As a method for cooling the electrodes and the subject to be processed 20, an air-cooling system may be used, for example. However, when a cooling medium such as air used in the air-cooling system is blown into a discharge space of the discharge unit, active species generated at the discharge unit might be blown off. This might deteriorate a plasma processing effect. In view of this, in the first embodiment, a cooling mechanism having a wind tunnel structure for preventing the cooling medium used in the air-cooling system from blowing into the discharge space of the discharge unit is provided to the discharge unit.

Figure 3:
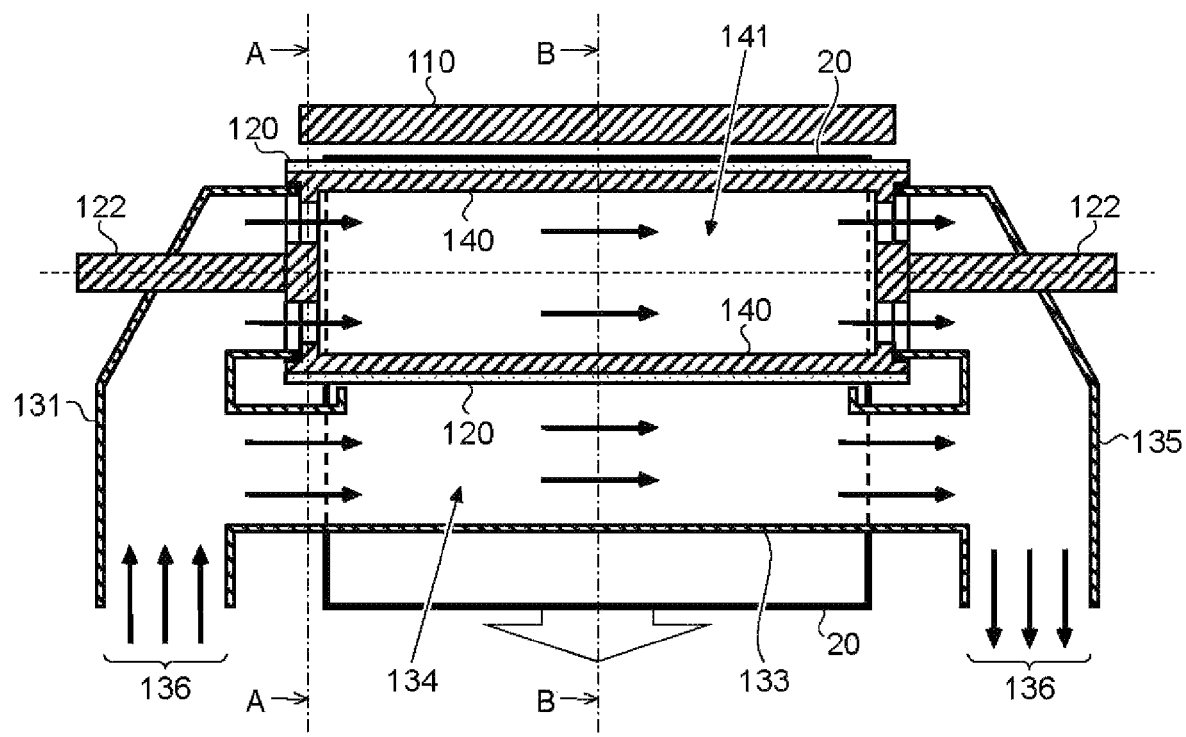
FIG. 3 is a sectional view illustrating an example of schematic configurations of a discharge unit and a cooling mechanism in the plasma processing device according to the first embodiment, and is a sectional view of the discharge unit and the cooling mechanism that are cut along a plane including a centerline of a blade-type discharge electrode extending in a direction perpendicular to a conveyance direction of a subject to be processed and a centerline of a counter electrode extending parallel to the discharge electrode.
Figure 4:
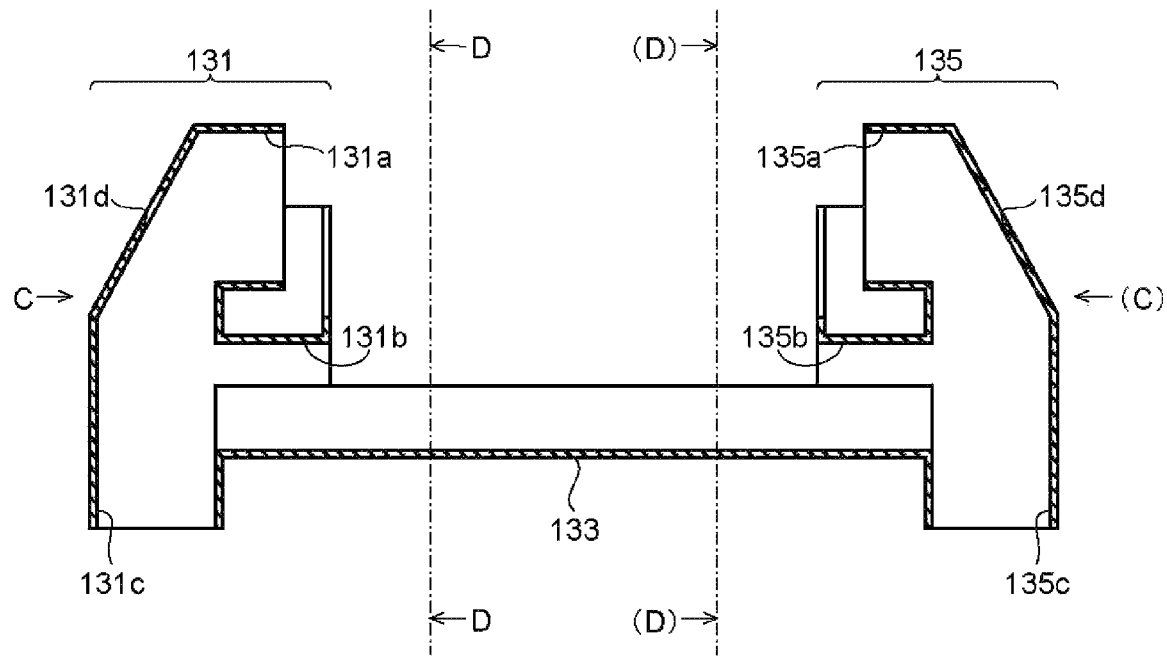
FIG. 4 is a sectional view of the cooling mechanism extracted from FIG. 3.
Figure 5A:
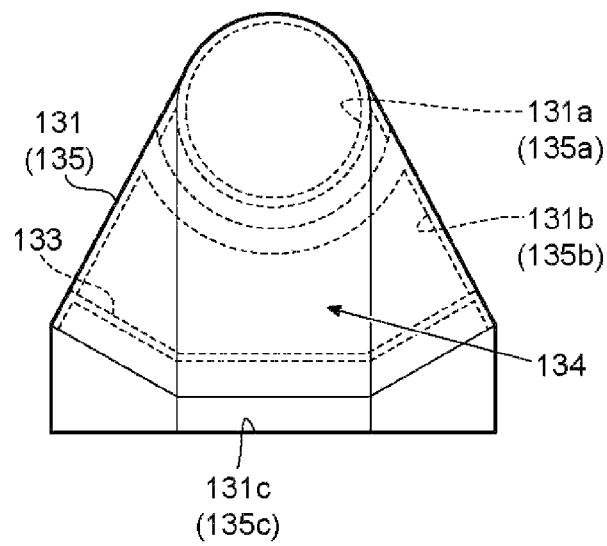
FIG. 5A is a side view of the cooling mechanism viewed from a C direction in FIG. 4.
Figure 5B:
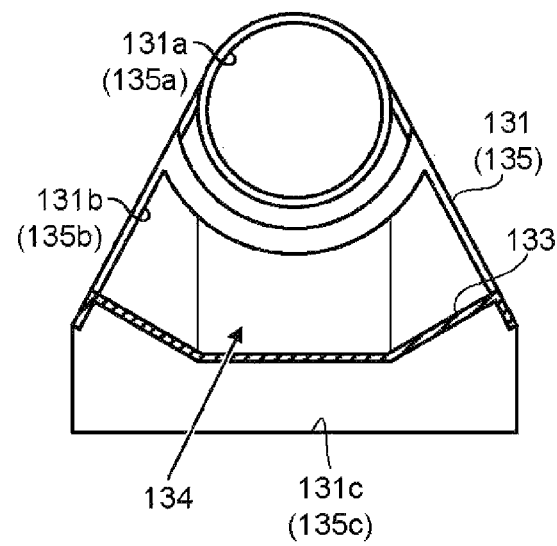
FIG. 5B is a side sectional view of the cooling mechanism taken along a D-D plane.
Figure 6:
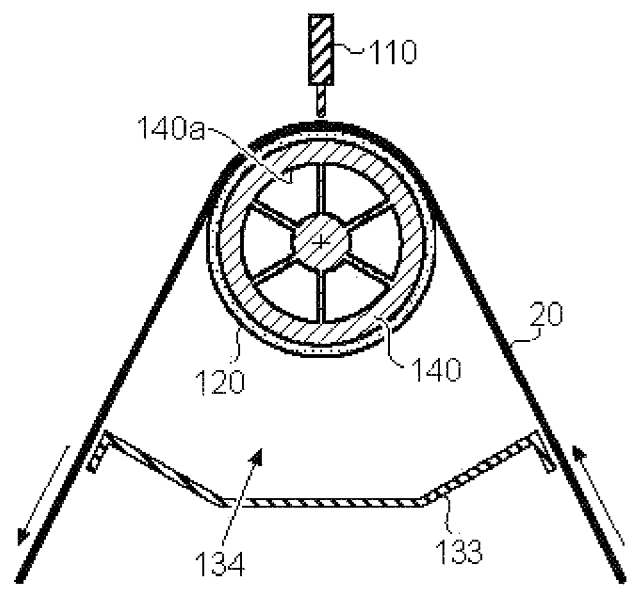
FIG. 6 is a view illustrating sectional structures of the discharge unit and the cooling mechanism that are cut along an A-A plane in FIG. 3.
Figure 7:
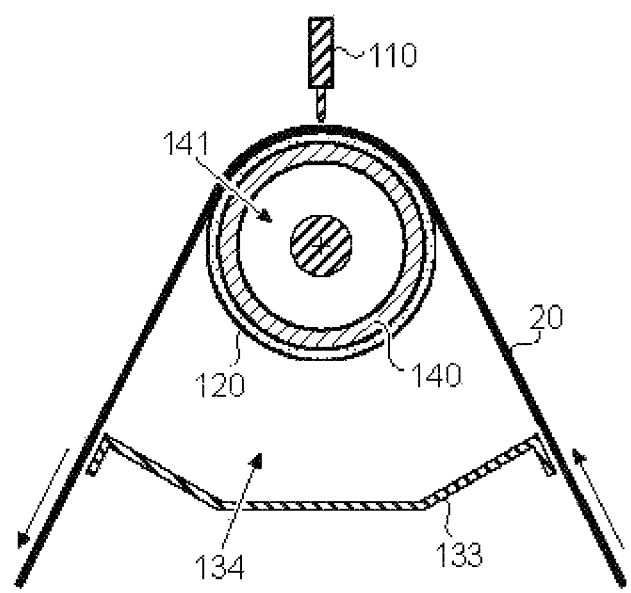
FIG. 7 is a view illustrating sectional structures of the discharge unit and the cooling mechanism that are cut along a B-B plane in FIG. 3.

FIGS. 3 to 7 are sectional views each illustrating an example of schematic configurations of a discharge unit and a cooling mechanism in the plasma processing device according to the first embodiment. FIG. 3 illustrates cross-sectional structures of the discharge unit and the cooling mechanism that are cut along a plane (C-C plane) including a centerline of the blade-type discharge electrode 110 extending in a direction perpendicular to the conveyance direction of the subject to be processed 20 and a centerline of the counter electrode 140 extending parallel to the discharge electrode 110. FIG. 4 is a sectional view of the cooling mechanism extracted from FIG. 3. FIGS. 5A and 5B each are a side view of the cooling mechanism viewed from a C direction in FIG. 4, and a side sectional view of the cooling mechanism cut along a D-D plane. FIG. 6 is a view illustrating sectional structures of the discharge unit and the cooling mechanism that are cut along an A-A plane in FIG. 3. FIG. 7 is a view illustrating sectional structures of the discharge unit and the cooling mechanism that are cut along a B-B plane in FIG. 3.

As illustrated in FIG. 3, the discharge unit includes the discharge electrode 110, the counter electrode 140, and the dielectric 120. The counter electrode 140 is made of a conductive material such as stainless steel (SUS), and has a hollow cylindrical shape. However, it is not limited thereto, and may have various shapes such as a tubular form whose cross-section is semicircular or a sector form. In this case, the counter electrode 140 is formed to have a hollow shape, which enables air-cooling from the inside of the counter electrode as described as an example later. When a cylindrical counter electrode 140 is employed, for example, the counter electrode 140 can be rotatable about its center axis. In this case, the counter electrode 140 is rotatably held by a rotation axis member 122 extending along the center axis.

The dielectric 120 is made of a dielectric such as alumina or silicon, and is provided in at least a region that is at the side opposite to the discharge electrode 110 and contributes to the discharge on the side face of the counter electrode 140. When the counter electrode 140 is rotatable, it is preferable that the dielectric 120 is formed throughout the entire side face of the counter electrode 140.

The configurations of the counter electrode 140 and the dielectric 120 are not limited to the above configurations, and various modifications are possible. For example, a belt-type (including an endless belt) dielectric illustrated in FIG. 1 and a counter electrode disposed opposing to a discharge electrode across the dielectric can be used.

The discharge electrode 110 has a blade shape, for example, and it is provided to extend in the direction parallel to the centerline of the counter electrode 140 with its leading end directing toward the counter electrode 140. The discharge electrode 110 is separated from the dielectric 120 to an extent such that the discharge electrode 110 is in contact with the subject to be processed 20 while passing through the gap between the discharge electrode 110 and the dielectric 120. Note that the discharge electrode 110 is not limited to a blade type, and various modifications are possible. For example, it may have a columnar shape (including an ellipse and cylinder) or a shape of a semicircular column. When the columnar discharge electrode 110 is used, the discharge electrode 110 may be rotatable about its centerline. This configuration enables the disposition of the discharge electrode 110 to be separated from the dielectric 120 to an extent such that it is in contact with the subject to be processed 20.

With the above configuration, plasma for plasma-processing the surface of the subject to be processed 20 occurs between the discharge electrode 110 and the dielectric 120 in response to an application of a high-voltage pulse to the discharge electrode 110 from a high-frequency high-voltage power source (not illustrated). Subsequently, the subject to be processed 20 passing through this plasma space is plasma-processed.

As illustrated in FIGS. 3 to 7, the cooling mechanism provided to the discharge unit is configured to prevent a cooling medium 136, such as air, from blowing into a plasma generating space at the discharge unit, and to form a cooling space that can air-cool the counter electrode 140 from at least one of an inside and an outside (in the figure, from both sides). As illustrated in FIGS. 4 and 5B, the cooling mechanism has a configuration in which cooling ducts 131 and 135 are disposed at both ends of the counter electrode 140 having a hollow structure 141 with both ends open.

Each of the cooling ducts 131 and 135 forms a hood shape that covers one opening (see an opening 140a in FIG. 6) of the counter electrode 140 and can substantially (e.g., to an extent of being capable of reducing or preventing the blowing of the cooling medium 136 into the discharge space) separate the discharge space and the cooling space with the subject to be processed 20 passing through the discharge space along the conveyance path D1 (see FIGS. 4 and 5).

Specifically, the cooling duct 131 at the upstream side in the flow of the cooling medium 136 has an inflow port 131c into which the cooling medium 136, such as air, flows, a connection port 131a formed consecutive to one opening 140a of the counter electrode 140, and a feed port 131b from which the cooling medium 136 flows below the counter electrode 140 (the side of the counter electrode 140 opposite to the side where the subject to be processed 20 passes). On the other hand, the cooling duct 131 at the downstream side in the flow of the cooling medium 136 has a connection port 135a formed consecutive to the other opening 140a of the counter electrode 140, an outlet port 135b from which the cooling medium 136 passing below the counter electrode 140 flow, and an exhaust port 135c for exhausting the cooling medium 136 flowed from the connection port 135a and the outlet port 135b.

When the counter electrode 140 is formed rotatable, the connection ports 131a and 135a of the cooling ducts 131 and 135 cover the openings 140a at both ends of the counter electrode 140 so as not to interfere the rotation of the counter electrode 140. With this configuration, a wind tunnel (second wind tunnel) for allowing the cooling medium 136 to flow from the cooling duct 131 to the cooling duct 135 via the hollow structure 141 in the counter electrode 140 is formed. In this case, the connection ports 131a and 135a may be in sliding contact with the ends of the counter electrode 140, or may be separated therefrom to an extent such that the blowing of the cooling medium 136 into the discharge space can be reduced or prevented. When the connection ports 131a and 135a are separated from the ends of the counter electrode 140, the ends of the counter electrode 140 are preferably formed into a shape receiving the connection ports 131a and 135a for avoiding the cooling medium 136 leaking from the gap from blowing toward the discharge space (i.e., a shape in which the inner diameters of the ends of the counter electrode 140 are larger than the outer diameters of the connection ports 131a and 135a) (see FIG. 3). When the counter electrode 140 is rotatable, openings 131d and 135d into which the rotation axis member 122 for holding the counter electrode 140 to be rotatable is inserted are formed on the cooling ducts 131 and 135 (see FIGS. 4 and 5A). On the other hand, when the counter electrode 140 is stationary, the connection ports 131a and 135a and the ends of the counter electrode 140 may be in close contact with each other to keep airtightness.

The cooling ducts 131 and the cooling ducts 135 may be connected with a partition wall 133. In this case, the cooling duct 131 and the cooling duct 135 may be detachable to the partition wall 133, or at least one of them may be adhered to the partition wall 133. The partition wall 133 is located below the counter electrode 140, and forms a wind tunnel (first wind tunnel) 134, which restricts a flow of the cooling medium 136, from the feed port 131b of the cooling duct 131 to the outlet port 135b of the cooling duct 135 in combination with the subject to be processed 20 passing through the discharge space along the conveyance path D1 (see FIGS. 3, 6, and 7). The partition wall 133 and the subject to be processed 20 are preferably separated from each other in order to avoid damage on the subject to be processed 20, while being conveyed, in consideration of the cooling medium 136 leaking from the wind tunnel 134.

In the above configuration, the cooling medium 136 flowed into the cooling duct 131 from the inflow port 131c is respectively blown from the connection port 131a and the feed port 131b. The cooling medium 136 may flow into the cooling duct 131 with a blower not illustrated or with a suction from the cooling duct 135. The cooling medium 136, which is blown from the connection port 131a, flows into the cooling duct 135 from the connection port 135a through the hollow structure 141 of the counter electrode 140. Accordingly, the counter electrode 140 is cooled from the inside. On the other hand, the cooling medium 136 blown from the feed port 131b flows into the cooling duct 135 from the outlet port 135b through the wind tunnel 134 formed below the counter electrode 140 with the subject to be processed 20 and the partition wall 133. Accordingly, the counter electrode 140 is externally cooled. In this case, the cooling medium 136 blows against the subject to be processed 20, whereby the subject to be processed 20 is directly cooled. The cooling medium 136 flowed into the cooling duct 135 is exhausted to the outside from the exhaust port 135c. Note that the subject to be processed 20 can also indirectly be cooled as a result of the counter electrode 140 is internally and externally cooled.

The temperature and flow rate of the cooling medium 136 flowing through the cooling space may be adjusted such that the temperature of the subject to be processed 20 (and the counter electrode 140) has an appropriate temperature range. The appropriate temperature range may be not less than a temperature for causing due condensation and a temperature that does not rise the temperature of the ink jet head 170 in the image forming device 40 more than an allowable range. This temperature range may be 5° C. or more and 40° C. or less, for example.

As described above, the first embodiment has the configuration of suppressing or preventing the flow of the cooling medium 136 into the discharge space upon internally and externally air-cooling the counter electrode 140. This configuration can reduce or prevent the blow-off of active species generated in the discharge space, thereby being capable of efficiently cooling the counter electrode 140 without deteriorating the effect of the plasma process. Further, this configuration can provide an effect of directly and indirectly cooling the subject to be processed 20 while being conveyed. As a result, a high-quality image can be formed. In addition, ink color development is enhanced due to the improvement in the effect of the plasma process, whereby an amount of deposited ink (used amount) can be reduced and, further, an effect of being capable of reducing drying energy after the printing can be obtained.

Second Embodiment

In the above embodiment, a sufficient clearance has to be provided between the subject to be processed 20 and the partition wall 133 for avoiding damage, such as a scratch, from being caused on the subject to be processed 20 due to the contact between the subject to be processed 20 while being conveyed and the partition wall 133. Therefore, there is a possibility in which the cooling medium 136 passing through the wind tunnel 134 leaks from the gap between the subject to be processed 20 and the partition wall 133. In view of the above problem, the second embodiment provides an example a configuration that can reduce or prevent the leakage of the cooling medium 136 from the gap between the subject to be processed 20 and the partition wall 133 without damaging the subject to be processed 20.

Figure 8:
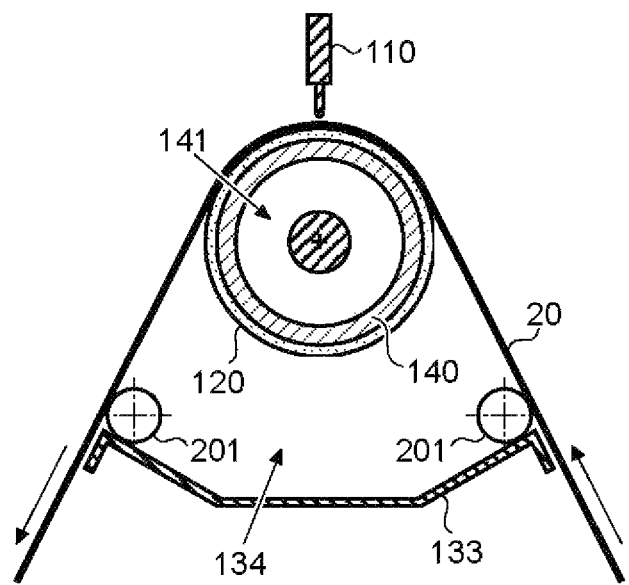
FIG. 8 is a sectional view illustrating an example of schematic configurations of a discharge unit and a cooling mechanism in a plasma processing device according to a second embodiment of the present invention.

FIG. 8 is a sectional view illustrating an example of schematic configurations of a discharge unit and a cooling mechanism in a plasma processing device according to the second embodiment. In the second embodiment, the basic configurations of the discharge unit and the cooling mechanism may be the same as the example of the schematic configurations of the discharge unit and the cooling mechanism according to the first embodiment described with reference to FIGS. 3 to 7. Therefore, in the illustration of FIG. 8 and the description below, sectional structures, corresponding to FIG. 7, of the discharge unit and the cooling mechanism on a B-B plane in FIG. 3 is only provided.

As illustrated in FIG. 8, in the second embodiment, rollers 201 for closing at least a part of the gap between the subject to be processed 20 and the partition wall 133 are provided in the configuration similar to the cooling mechanism illustrated in the first embodiment. The roller 201 has a length equal to or longer than the partition wall 133, and mounted at the position contacting the subject to be processed 20 while being conveyed. In this case, the roller 201 may be held so as to be freely rotatable about its centerline, or may be rotationally driven to convey the subject to be processed 20, like an unillustrated conveyance roller.

The second embodiment has the above configuration, thereby being capable of reducing or preventing the leakage of the cooling medium 136 from the gap between the partition wall 133 and the subject to be processed 20 while being conveyed. Therefore, the second embodiment can further enhance an air-cooling effect. Since other configuration, operation, and effect are the same as those in the above embodiment, the detailed description thereof will not be repeated.

Third Embodiment

The above embodiment describes the case in which the counter electrode 140 is cooled with an air-cooling system. However, the embodiment is not limited thereto. For example, liquid such as water can be used as the cooling medium.

When liquid is used as the cooling medium, it is necessary to prevent the liquid from being in direct contact with the counter electrode 140 (including the dielectric 120) and the subject to be processed 20. In view of this, as illustrated in FIG. 9, for example, one or more tubes 301 rotating with the rotation of the counter electrode 140 may be disposed to be in contact with the dielectric 120 around the counter electrode 140, and liquid cooling medium 302 such as water may flow into the tubes 301.

When liquid cooling medium 302 flows through the hollow structure 141 in the counter electrode 140, it can be configured such that a holding mechanism for holding both ends of the counter electrode 140 to be rotatable while maintaining water-tightness is used instead of the cooling ducts 131 and 135, and the liquid cooling medium 302 flows in the holding mechanism. In this case, the inside of the counter electrode 140 may be coated with a dielectric to prevent the inner wall of the counter electrode 140 from being in direct contact with the liquid cooling medium 302.

Figure 9:
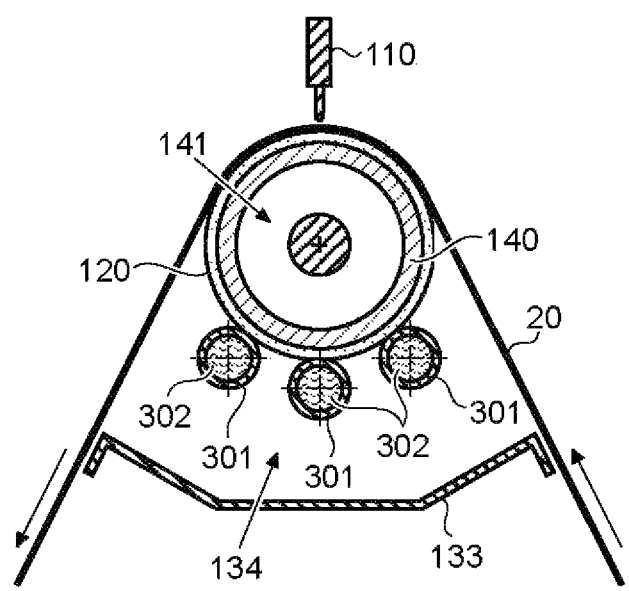
FIG. 9 is a sectional view illustrating an example of schematic configurations of a discharge unit and a cooling mechanism in a plasma processing device according to a third embodiment of the present invention.

It is to be noted that, as illustrated in FIG. 9, the cooling mechanism of the liquid-cooling system illustrated in the third embodiment can be used together with the cooling mechanism of the air-cooling system illustrated in the above embodiment. With this configuration, cooling capability of the cooling mechanism is enhanced, whereby the effect due to the cooling can further be enhanced. Since other configuration, operation, and effect are the same as those in the above embodiment, the detailed description thereof will not be repeated.

Fourth Embodiment

In the cooling mechanism of an air-cooling system illustrated in the above embodiment, a labyrinth seal structure may be used for the connection between the connection ports 131a and 135a of the cooling ducts 131 and 135 and both ends of the counter electrode 140.

Figure 10:
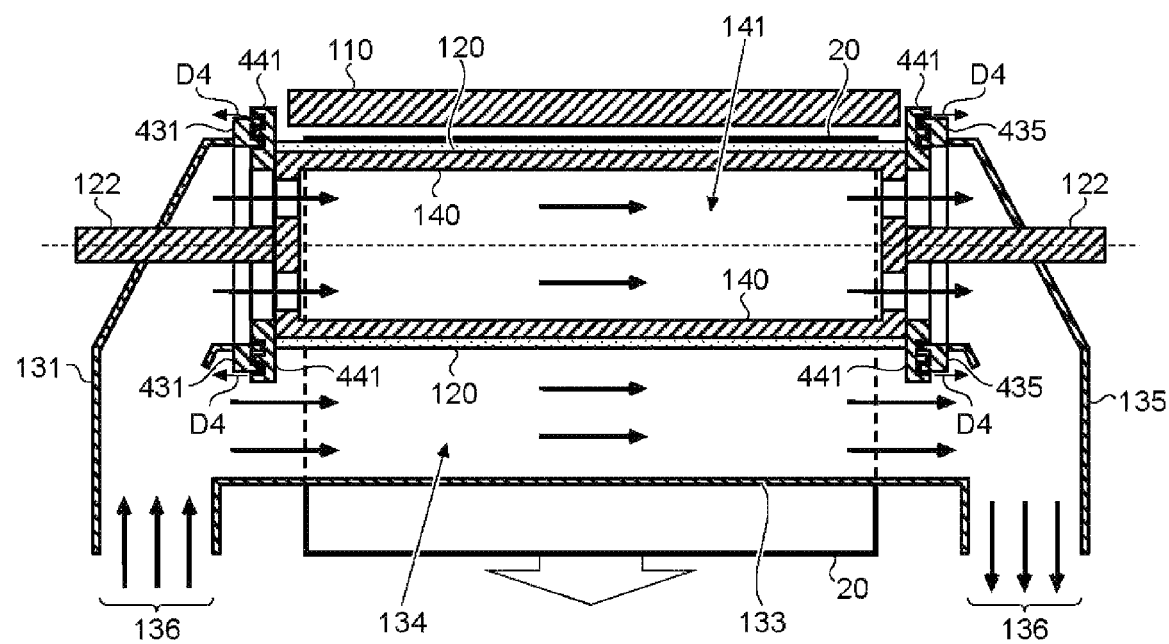
FIG. 10 is a sectional view illustrating an example of schematic configurations of a discharge unit and a cooling mechanism in a plasma processing device according to a fourth embodiment of the present invention.

FIG. 10 is a sectional view illustrating an example of schematic configurations of a discharge unit and a cooling mechanism in a plasma processing device according to a fourth embodiment. In the fourth embodiment, the basic configurations of the discharge unit and the cooling mechanism may be the same as the example of the schematic configurations of the discharge unit and the cooling mechanism according to the first embodiment described with reference to FIGS. 3 to 7. Therefore, in the illustration of FIG. 10 and the description below, an example of the schematic configurations of the discharge unit and the cooling mechanism corresponding to FIG. 3 is provided.

As illustrated in FIG. 10, in the air-cooling mechanism using the labyrinth seal structure, axial labyrinths 441 are provided at both ends of the counter electrode 140 having the hollow structure 141. In addition, axial labyrinths 431 and 435 that are respectively engaged with the axial labyrinths 441 at the counter electrode 140 are provided respectively to the portions of the cooling ducts 131 and 135 connected with the counter electrode 140. The application of the labyrinth seal structure described above can enhance airtightness at the connection portion, whereby the cooling effect with air-cooling from the inside of the counter electrode 140 is further enhanced. In addition, the amount of the cooling medium 136 leaking from the connection portion can be reduced, which can prevent the diffusion of active species caused by the blowing of the cooling medium 136, resulting in that the plasma processing effect can further be enhanced.

In the configuration illustrated in FIG. 10, the outermost walls of the axial labyrinths 441 at the counter electrode 140 are located exterior to the outermost walls of the axial labyrinths 431 and 435 at the cooling ducts 131 and 135. This configuration can allow the cooling medium 136 slightly leaking from the connection portion to flow in a direction D4 (direction opposite to the discharge unit) in FIG. 10. Accordingly, the diffusion of the active species, generated in the discharge unit, by the leaking cooling medium 136 can additionally be reduced, whereby the plasma processing effect can further be enhanced.

Since other configuration, operation, and effect are similar to the above embodiment, the detailed description thereof will not be repeated herein.

The present invention can provide a plasma processing device that can modify a surface of a subject to be processed in order that a high-quality printed matter can be created, and an image forming apparatus provided with the same.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A plasma processing device comprising:
   a first electrode;
   a second electrode which is disposed opposing to the first electrode to form a discharge space, has a hollow inside, and has both ends open; and
   a partition wall disposed at the side opposite to the first electrode with respect to the second electrode forming a first wind tunnel in combination with a substrate to be processed, when the substrate to be processed is present in the discharge space, the first wind tunnel restricting a flow of a first cooling medium.

2. The plasma processing device according to claim 1, further comprising a member disposed to be in contact with the substrate to be processed along a gap formed between the substrate to be processed and the partition wall.

3. The plasma processing device according to claim 2, wherein the member is a roller that can rotate with the movement of the substrate to be processed in a predetermined direction.

4. The plasma processing device according to claim 1, further comprising one or more tubes including a flow channel through which a second cooling medium can pass, the tubes being disposed to be in contact with the second electrode at the side opposite to the first electrode with respect to the second electrode.

5. The plasma processing device according to claim 1, further comprising two ducts communicating with the openings at both ends of the second electrode, wherein
   the two ducts form, in combination with the second electrode, a second wind tunnel for allowing the first cooling medium to flow from one duct to the other duct through the wind tunnel in the second electrode.

6. The plasma processing device according to claim 5, further comprising axial labyrinths provided respectively to connection portions between the openings and the ducts at both ends of the second electrode.

7. The plasma processing device according to claim 6, wherein inner diameters of outermost walls of the axial labyrinths provided to the second electrode are larger than outer diameters of outermost walls of the axial labyrinths provided at the ducts.

8. An image forming apparatus comprising:
   a plasma processing device; and
   an ink jet recording device that forms an image onto a substrate to be processed that has already undergone a plasma process with the plasma processing device, using an ink jet recording system, wherein the plasma processing device includes a first electrode, a second electrode which is disposed opposing to the first electrode to form a discharge space, has a hollow inside, and has both ends open, and
   a partition wall disposed at the side opposite to the first electrode with respect to the second electrode forming a first wind tunnel in combination with the substrate to be processed, when the substrate to be processed is present in the discharge space, the first wind tunnel restricting a flow of a first cooling medium.

\* \* \* \* \*